United States Patent
Oh et al.

(10) Patent No.: US 8,536,914 B2
(45) Date of Patent: Sep. 17, 2013

(54) DLL INCLUDING 2-PHASE DELAY LINE AND DUTY CORRECTION CIRCUIT AND DUTY CORRECTION METHOD THEREOF

(75) Inventors: Ji Hun Oh, Hwaseong-si (KR); Donghwan Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 190 days.

(21) Appl. No.: 13/033,057

(22) Filed: Feb. 23, 2011

(65) Prior Publication Data

US 2011/0215851 A1   Sep. 8, 2011

(30) Foreign Application Priority Data

Mar. 2, 2010   (KR) ........................ 10-2010-0018656

(51) Int. Cl.
*H03L 7/06* (2006.01)
(52) U.S. Cl.
USPC .......................................... 327/158
(58) Field of Classification Search
None
See application file for complete search history.

(56) References Cited

U.S. PATENT DOCUMENTS

| | | | |
|---|---|---|---|
| 6,603,337 B2 | 8/2003 | Cho | |
| 7,227,809 B2* | 6/2007 | Kwak | 365/189.15 |
| 7,259,604 B2* | 8/2007 | Gomm | 327/175 |
| 7,830,186 B2* | 11/2010 | Yun et al. | 327/158 |
| 8,049,545 B2* | 11/2011 | Kim et al. | 327/158 |
| 8,063,680 B2* | 11/2011 | Choi | 327/158 |
| 8,081,021 B2* | 12/2011 | Ku | 327/158 |
| 2009/0160516 A1 | 6/2009 | Guo et al. | |

FOREIGN PATENT DOCUMENTS

| | | |
|---|---|---|
| JP | 2002-290214 A | 10/2002 |
| KR | 10 2002-00562 A | 7/2002 |
| KR | 10-0808594 B1 | 2/2008 |

* cited by examiner

*Primary Examiner* — Lincoln Donovan
*Assistant Examiner* — Khareem E Almo
(74) *Attorney, Agent, or Firm* — Lee & Morse, P.C.

(57) ABSTRACT

Provided are a delay locked loop (DLL), which is capable of being adopted at a data processing system and include a duty correction circuit, and a duty correction method at the DLL. The duty correction method includes generating first and second delay clock signals having different phase shifts by delaying an external clock signal by as much as first and second set phases in response to a delay control signal, generating first and second first signals respectively synchronized with the first and second delay clock signals, and generating an output clock signal having a set duty ratio by using the first and second pulse signals. According to the foregoing, a more accurate duty correction operation is performed without a half cycle time delay line or a matching delay line.

17 Claims, 5 Drawing Sheets

DLL INCLUDING 2-PHASE DELAY LINE AND DUTY CORRECTION CIRCUIT AND DUTY CORRECTION METHOD THEREOF

BACKGROUND

1. Field

The present disclosure herein relates to a delay locked loop and, more specifically, to a delay locked loop including a duty correction circuit and a duty correction method thereof.

2. Description of the Related Art

Typically, a synchronous semiconductor memory device capable of being mounted on a data processing device such as a computer or a portable electronic device adopts a delayed locked loop (hereinafter referred to as "DLL").

A DLL generates an internal clock signal phase-locked with an external clock signal as an output clock signal to perform an operation of a semiconductor device synchronously with the external clock signal. That is, because timing delay unavoidably occurs when an internally used clock signal passes a block buffer and a transmission line of a semiconductor device, the DLL serves as a phase adjuster to synchronize the internal clock signal with the external clock signal.

In case of a semiconductor memory device using an output clock signal generated from a DLL, a signal timing margin may be maximally secured when a duty cycle rate of the output clock signal is maintained at 50 percent. However, the duty ratio of the output clock signal frequently deviates from the 50 percent due to characteristics of a jitter outside the DLL and non-uniform delay values of delay elements inside the DLL. Thus, a duty correction circuit has been conventionally adopted in a DLL to perform a duty correction operation.

Especially, in case of an intellectual property (IP) that is sensitive to a duty of a clock, like a double data rate (DDR) type semiconductor memory device, it is almost essential that a duty correction circuit (hereinafter referred to as "DCC") be embedded in a DLL.

Significant issues of the DCC are a more accurate duty correction operation, easy implementation of the DCC, and a smaller area occupied by a chip.

However, a conventional duty correction circuit has generated an output clock signal of a 50-percent duty ratio by using a 180-degree phase delayed clock signal and a 0-degree phase delayed clock signal. Such a duty correction circuit needs to additionally include a half cycle time delay line (HCDL) and a matching delay line (MDL) in a DLL. That is, the HCDL is needed to measure a one-clock period and generate a 180-degree clock signal delayed as great as a half cycle and the MDL is needed to compensate intrinsic delay of the HCDL.

After obtaining the number (N) of delay cells required for one cycle, the HCDL uses N/2 delay cells to practically delay a half cycle. Thus, when N is an odd number, a quantization error is inevitably reflected on a duty by one-half unit delay.

With the recent trend toward high-speed operation, high integration density, and low power consumption of semiconductor devices, there is a need for a duty correction circuit which is capable of securing a duty ratio of more improved accuracy and a delay locked loop (DLL) adopting the duty correction circuit.

SUMMARY

Embodiments are therefore directed to a delay locked loop including 2-phase delay line and duty correction circuit and duty correction method thereof, which substantially overcome one or more of the problems due to the limitations and disadvantages of the related art.

It is therefore a feature of an embodiment to provide a delay locked loop including a duty correction circuit for securing a duty ratio of more improved accuracy.

It is therefore another feature of an embodiment to provide a method of duty correction in a delay locked loop including a duty correction circuit for securing a duty ratio of more improved accuracy.

At least one of the above and other features and advantages may be realized by providing a delay locked loop including, a phase detection circuit configured to generate a phase detection signal by comparing a phase of an output clock signal with a phase of an external clock signal, a delay control circuit configured to generate a delay control signal for determining delay time in response to the phase detection signal, a 2-phase delay line configure to generate first and second delay clock signals having different phase shifts by delaying the external clock signal by as much as first and second set phases in response to the delay control signal, and a duty correction circuit configured to perform duty correction such that a duty cycle of the output clock signal has a set duty ratio by using the first and second delay clock signals.

At least one of the above and other features and advantages may also be realized by providing a duty correction method in a delay locked loop including a duty correction circuit, including generating first and second delay clock signals having different phase shifts by delaying an external clock signal by as much as first and second set phases in response to a delay control signal, generating first and second first signals respectively synchronized with the first and second delay clock signals, and generating an output clock signal having a set duty ratio by using the first and second pulse signals.

In some example embodiments of the inventive concept, the second delay clock signal is a 360-degree phase delayed version of the external clock signal when the first delay clock signal is a 180-degree phase delayed version of the external clock signal.

In some example embodiments of the inventive concept, the 2-phase delay line may include first and second delay cell groups each including coarse delay cells having a plurality of set unit delays and a fine delay cell having a half delay of the set unit delay while being enabled.

In some example embodiments of the inventive concept, the duty correction circuit may include a first pulse generator configured to generate a first pulse signal synchronized with a rising edge of the first delay clock signal, a second pulse generator configured to a second pulse signal synchronized with a rising edge of the second delay clock signal, and a latch configured to output the output clock signal having the set duty ratio by using the first and second pulse signals.

In some embodiments of the inventive concept, the latch may be an SR flip-flop performing an SR latch operation by receiving the first pulse signal at its reset input terminal and receiving the second pulse signal at its set input terminal. The set duty ratio may be a 50-percent duty cycle.

In some embodiments of the inventive concept, the second delay clock signal may be a 360-degree phase delayed version of the external clock signal when the first delay clock signal is a 180-degree phase delayed version of the external clock signal.

In some embodiments of the inventive concept, the first and second delay clock signals may be generated by first and second cell groups which are symmetrical with each other. Each of the first and second delay cell groups may include coarse delay cells having a plurality of set unit delays and a fine delay cell having a half delay of the set unit delay while being enabled.

In some embodiments of the inventive concept, generating an output clock signal may be carried out by an SR flip-flop performing an SR latch operation by receiving the first pulse signal at its reset input terminal and receiving the second pulse signal at its set input terminal. The first and second pulse signals may be generated in synchronization with rising edges of the first and second delay clock signals, respectively.

In some embodiments of the inventive concept, the first and second pulse signals may be pulses having a duty cycle less than 50 percent.

The present disclosure also provides a data processing system with a delay locked loop (DLL) including a phase detection circuit generating a phase detection signal by comparing a phase of an output clock signal with a phase of an external clock signal and a delay control circuit generating a delay control signal for determining delay time in response to the phase detection signal. In the data processing system, the DLL may include a 2-phase delay line configured to generate first and second delay clock signals by delaying the external clock signal by as much as first and second set phases in response to the delay control signal and a duty correction circuit configured to perform duty correction by using the first and second delay clock signals such that a duty cycle of the output clock signal has a set duty ratio.

In some embodiments of the inventive concept, the data processing system may be an SDRAM or a memory controller In some embodiments of the inventive concept, the duty correction circuit may include a first pulse generator configured to generate a first pulse signal synchronized with a rising edge of the first delay clock signal, a second pulse generator configured to generate a second pulse signal synchronized with a rising edge of the second delay clock signal, and an SR latch configured to output the output clock signal having the set duty ratio by using the first and second pulse signals.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
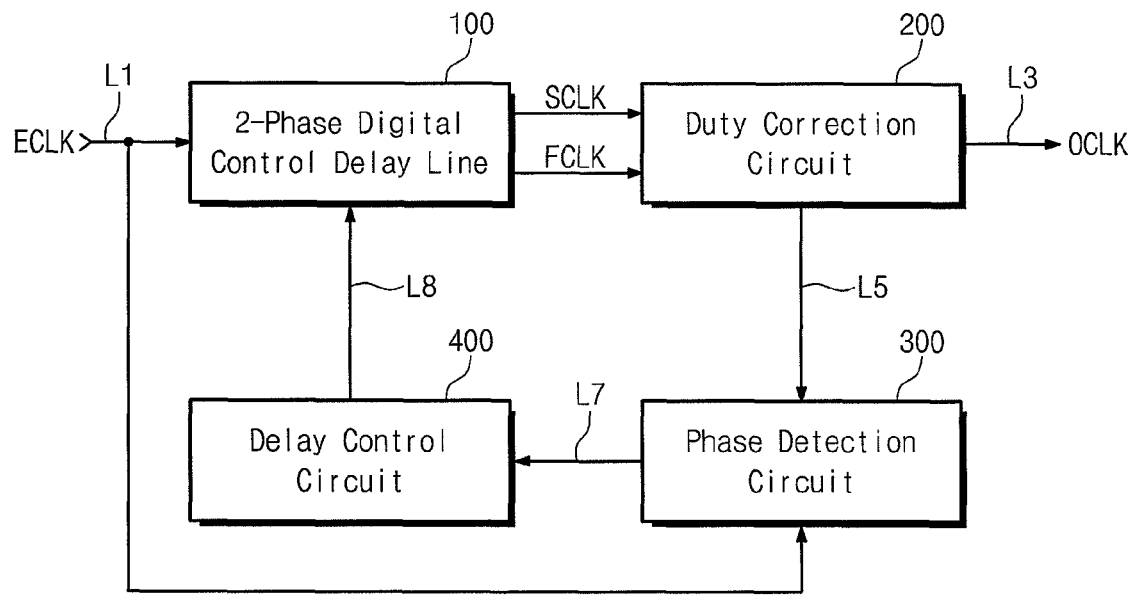
FIG. 1 illustrates a block diagram of a delay locked loop (DLL) according to embodiments of the inventive concept.

Korean Patent Application No. 10-2010-0018656, filed on Mar. 2, 2010, in the Korean Intellectual Property Office, and entitled: "DLL Including 2-Phase Delay Line and Duty Correction Circuit and Duty Correction Method Thereof," is incorporated by reference herein in its entirety The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept.

It will be understood that when an element is referred to as being "connected" or "coupled" to another element, it may be directly connected or coupled to the other element or intervening elements may be present.

Moreover, the same or similar reference numerals represent the same or similar elements throughout the specification. In several drawings, connection relations between elements and parts are merely made for effective explanation of technical contents while other elements or circuit blocks may be further provided.

It is noted that each embodiment described and illustrated herein includes its complementary embodiments as well, and a typical circuit configuration of a DLL or an operation of a DLL having the configuration are omitted to avoid confusion about the key points of the inventive concept.

FIG. 1 is a block diagram of a delay locked loop (DLL) according to embodiments of the inventive concept. As illustrated, the DLL includes a 2-phase digital control delay line 100, a duty correction circuit 200, a phase detection circuit 300, and a delay control circuit 400.

The phase detection circuit 300 is connected to the duty correction circuit 200 through a line L5 and compares a phase of an output clock signal OCLK with a phase of an external clock signal ECLK to generate a phase detection signal. The phase detection circuit 300 may be configured using a digital circuit. In that case, the phase detection signal is generated as digital data. The phase detection circuit 300 may compare the external clock signal ECLK with a 360-degree phase delayed version of the external clock signal ECLK instated of comparing the phase of the output clock signal OCLK with the phase of the external clock signal ECLK.

The delay control circuit 40 is connected to the phase detection circuit 300 through a line L7 and generates a delay control signal to determine delay time in response to the phase detection circuit.

The 2-phase digital control delay line 100 is connected to the delay control circuit 400 through a line L8 and receives the external clock signal ECLK through a line L1. The 2-phase digital control delay line 100 delays the external clock signal ECLK by first and second set phases to generate first and second delay clock signals FCLK and SCLK of different phase shifts.

Figure 3:
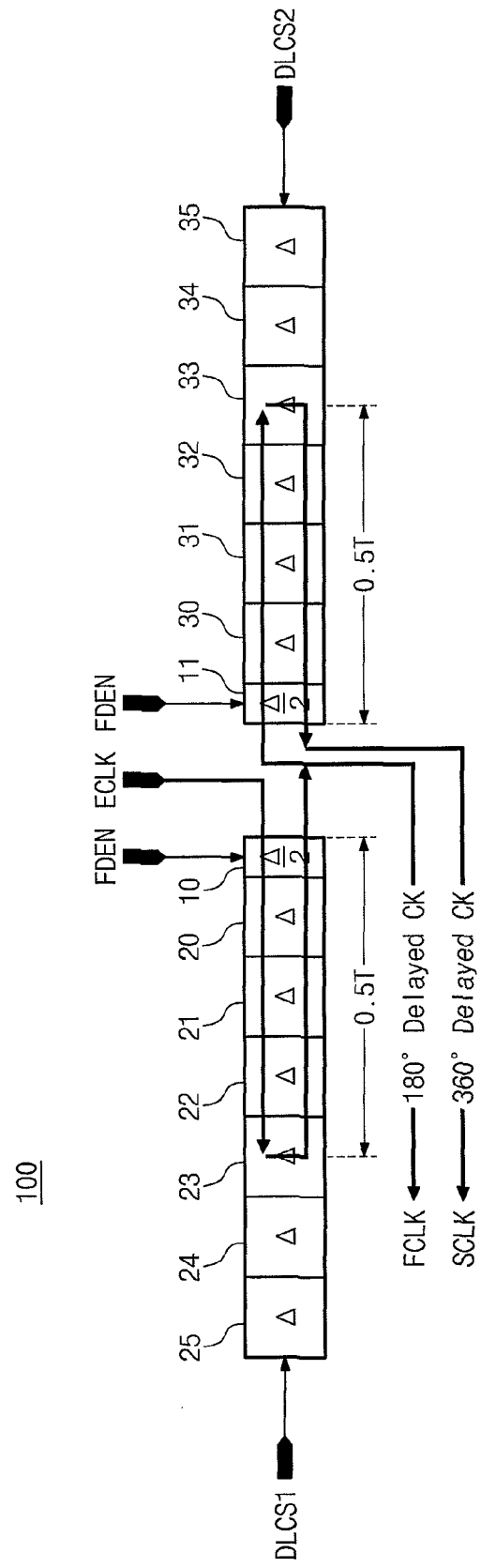
FIG. 3 illustrates an implementation example of a 2-phase control delay line shown in FIG. 1.

For example, the 2-phase digital control delay line 100 may be implemented as shown in FIG. 3.

Figure 2:
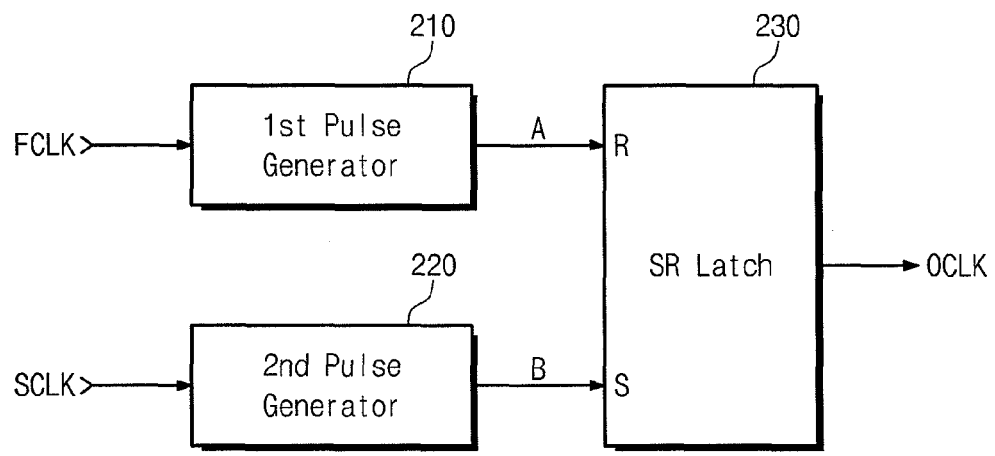
FIG. 2 illustrates an implementation example of a duty correction circuit shown in FIG. 1.

The duty correction circuit 200 performs duty correction by using the first and second delay clock signals FCLK and SCLK such that a duty cycle of the output clock signal OCLK has a predetermined duty ratio (e.g., 50 percent). The duty correction circuit 200 may be configured as shown in FIG. 2.

Since the DLL configured as shown in FIG. 1 includes the 2-phase digital control delay line 100, it need not include a half cycle time delay line or a matching delay line.

If the first delay clock signal FCLK output from the 2-phase digital control delay line 100 is a 180-degree phase delayed version of the external clock signal ECLK, the second delay clock signal SCLK may be a 360-degree phase delayed version of the external clock signal ECLK. As a result, because the first delay clock signal FCLK and the second delay clock signal SCLK are generated at the 2-phase digital control delay line 100, a half cycle time delay line is not required. Moreover, because the second delay clock signal SCLK that is a 360-degree phase delayed version of the external clock signal ECLK is used as a clock for duty correction instead of an input external clock signal ECLK, a matching delay line for compensating an intrinsic delay of a delay line is not also required.

Referring to FIG. 3, the 2-phase digital control delay line 100 comprises first and second delay cell groups that are arranged to be symmetrical with each other.

That is, the first delay cell group may include coarse delay cells 20 and 21~25 having a plurality of predetermined unit delays and a fine delay cell 11 having a half delay of the predetermined unit delay.

In FIG. 3, if an external clock signal ECLK is applied and the fine delay cell 10 and the coarse delay cells 20, 21, 22, and 23 are enabled by a second delay cell group control signal DLCS2 to participate in a delay operation, a 180-degree phase delayed version of the external clock signal ECLK, i.e., a first delay clock signal FCLK is generated. In this case, the fine delay cell 10 is enabled by activation of a fine delay enable signal FDEN.

In addition, if the fine delay cell 11 and the coarse delay cells 30, 31, 32, and 33 are enabled by a second delay cell group control signal DLCS2 to participate in a delay operation, a 360-degree phase delayed version of the external clock signal ECLK, i.e., a second delay clock signal SCLK is generated. In this case, the fine delay cell 11 is enabled by activation of the fine delay enable signal FDEN.

The fine delay enable signal FDEN and the first and second delay cell group control signals DLCS1 and DLSC2 may be generated using the delay control signal.

More specifically, if the coarse delay cell 20 has a unit delay set as great as Δ, the fine delay cell 10 has a delay set as great as 0.5Δ. If the number of unit delay cells required for locking one clock period is n, n/2 coarse delay cells are enabled to each delay cell group. Because dividing n by 2 makes a residual when the n is an odd number, there may be an error as great as one unit delay. In order to overcome the error, there is a fine delay cell in each delay cell group. As a result, when the n is an odd number, the fine delay cell is enabled to eliminate an error.

Figure 4:
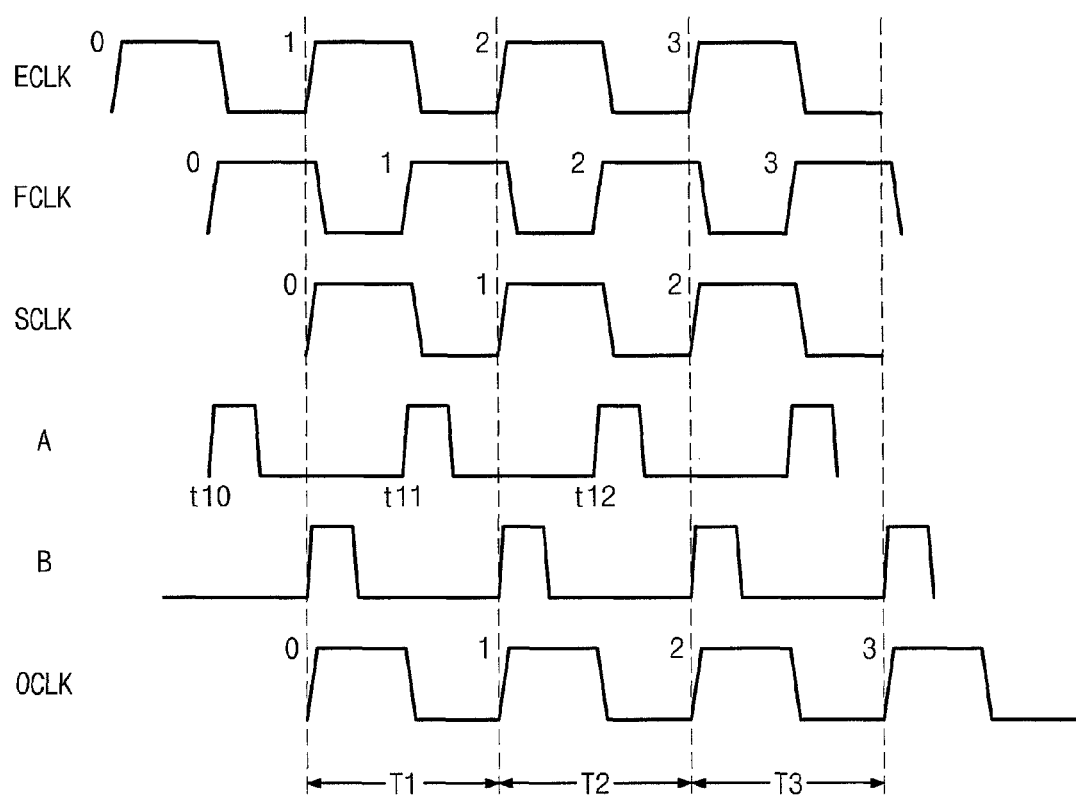
FIG. 4 illustrates an operation timing diagram of signal waveforms associated with FIG. 1.

FIG. 4 is an operation timing diagram of signal waveforms associated with FIG. 1. More specifically, FIG. 4 correspondingly shows timings of the first delay clock signal FCLK, the second delay clock signal SCLK, a first pulse signal A synchronized with a rising edge of the first delay clock signal FCLK, a second pulse signal B synchronized with a rising edge of the second clock signal SCLK, and an output clock signal OCLK.

Referring now to FIG. 2, the duty correction circuit 200 includes a first pulse generator 210, a second pulse generator 220, and an SR latch 230.

The first pulse generator 210 generates a first pulse signal A which is synchronized with a rising edge of the first delay clock signal FCLK. As illustrated in FIG. 4, the first pulse signal A is generated in synchronization with the rising edge of the first delay clock signal FCLK at time points t10, t11, and t12.

The second pulse generator generates a second pulse signal B synchronized with a rising edge of the second delay clock signal SCLK. As can be seen from the timing diagram in FIG. 4, the second pulse signal B is synchronized with the ring edge of the second delay clock signal SCLK.

The SR latch 230 receives the first pulse signal A at its reset input terminal R and receives the second pulse signal B at its set input terminal S to perform an SR latch operation such that the output clock signal OCLK having a duty cycle of 50 percent is output using the first and second pulse signals A and B. That is, the SR latch 230 may be configured using an SR flip-flop. The SR latch 230 performs a reset operation when a 180-degree delayed clock FCLK is high and performs a set operation when a 360-degree delayed clock SCLK is high, generating an output clock signal having a duty cycle of 50 percent.

Accordingly, the output clock signal OCLK shown in the timing diagram of FIG. 4 is obtained. Time periods T1, T2, and T3 each represent one clock cycle. It may be understood that a duty ratio of the output clock signal OCLK is 50 percent within the respective clock periods T1, T2, and T3.

The first and second pulse signals A and B are generated as a narrow pulse, which is aimed at preventing the reset input terminal R and the set input terminal S of the SR latch 230 from becoming high at the same time. That is, the first and second pulse signals A and B are generated as a narrow pulse having a smaller duty cycle than 50 percent to prevent an impossible state of the SR latch 230.

As described above, a duty correction method at a delay locked loop (DLL) including a duty correction circuit includes delaying an external clock signal as much as first and second set phases to generate first and second delay clock signals having different phase shifts, generating first and second pulse signals respectively synchronized with the first and second delay clock signals, and generating an output clock signal having a set duty ratio by using the first and second pulse signals. Thus, the DLL need not include a half cycle time delay line or a matching delay line.

Figure 5:
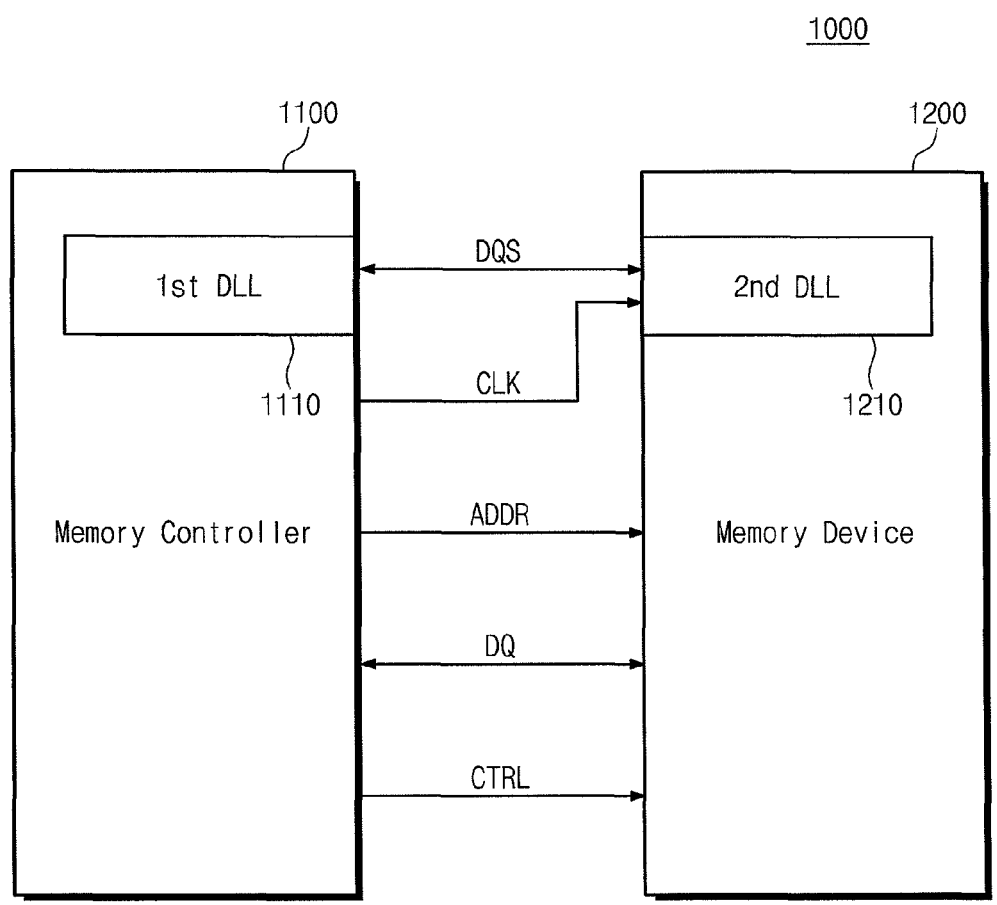
FIGS. 5 and 6 illustrate examples of applying the DLL shown in FIG. 1 to data processing systems, respectively.
Figure 6:
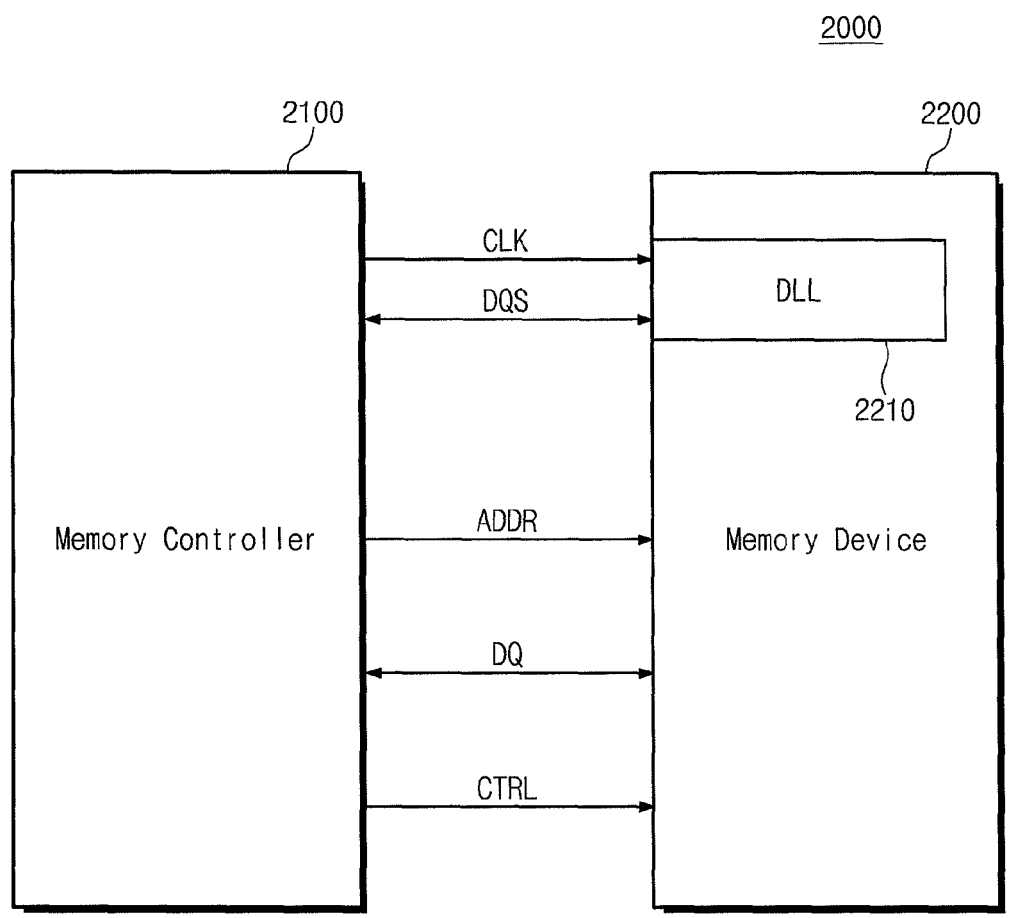

FIGS. 5 and 6 illustrate examples of applying the DLL shown in FIG. 1 to data processing systems, respectively.

Referring now to FIG. 5, a data processing system 1000 includes a memory controller 1100 and a memory device 1200.

The memory controller 1100 transmits a clock signal CLK, an address signal ADDR, a data strobe signal DQS, a data input/output signal DQ, and control signals CTRL to the memory device 1200. The memory device 1200 transmits the data strobe signal DQS and the data input/output signal DQ to the memory controller 1100. The memory device 1200 may be a semiconductor memory device such as, for example, a DRAM or an SRAM.

The data strobe signal DQS may be generated at a first delay locked loop (DLL) 1110 in the memory controller to be output in synchronization with the data input/output signal DQ. The data strobe signal DQS is applied to a second delay locked loop (DLL) 1210 of the memory device. The second DLL 1210 is synchronized with the clock signal CLK and generates a duty-corrected output clock signal to latch the data input/output signal DQ applied to the memory device 1200. In this case, the second DLL shown in FIG. 5 may be implemented as a DLL having the same configuration as shown in FIG. 1. In addition, the first DLL 1110 may be implemented as a DLL shown in FIG. 1.

Referring to FIG. 6, a data processing system 2000, such as a memory system, includes a memory controller 2100 and a memory device 2200. Unlike the case of FIG. 5, a delay locked loop (DLL) is not adopted in the memory controller 2100 while being adopted only in the memory device 2200. It will be understood that in the data processing system 2000 shown in FIG. 6, the DLL 2210 may be implemented as a DLL having the same configuration as shown in FIG. 1.

According to the above-described embodiments in which a duty correction is performed using a 2-phase delay line, there is obtained a delay locked loop (DLL) which is capable of performing a more accurate duty correction operation without a half cycle time delay line or a matching delay line. In addition, the DLL may contribute to decrease in manufacturing cost because of easy implementation and more compact size. Moreover, a quantization error may be eliminated because a fine delay cell having a half delay may be selectively driven during a duty correction operation.

While the inventive concept has been described with reference to exemplary embodiments, it will be apparent to those skilled in the art that various changes and modifications may be made without departing from the spirit and scope of the inventive concept. For example, an internal circuit configuration of a 2-phase digital control delay line or an arrangement order or detailed configurations of circuit blocks connected thereto may be variously changed or modified without departing from the spirit and scope of the inventive concept.

What is claimed is:

1. A delay locked loop (DLL) comprising:
a phase detection circuit configured to generate a phase detection signal by comparing a phase of an output clock signal with a phase of an external clock signal;
a delay control circuit configured to generate a delay control signal for determining delay time in response to the phase detection signal;
a 2-phase delay line configured to generate first and second delay clock signals having different phase shifts by delaying the external clock signal by as much as first and second set phases in response to the delay control signal; and
a duty correction circuit configured to perform duty correction such that a duty cycle of the output clock signal has a set duty ratio by using the first and second delay clock signals, wherein the duty correction circuit includes:
a first pulse generator configured to generate a first pulse signal synchronized with a rising edge of the first delay clock signal,
a second pulse generator configured to a second pulse signal synchronized with a rising edge of the second delay clock signal, and
a latch configured to output the output clock signal having the set duty ratio by using the first and second pulse signals.

2. The DLL as claimed in claim 1, wherein the first delay clock signal is a 180-degree phase delayed version of the external clock signal.

3. The DLL as claimed in claim 2, wherein the second delay clock signal is a 360-degree phase delayed version of the external clock signal.

4. The DLL as claimed in claim 1, wherein the second delay clock signal is a 360-degree phase delayed version of the external clock signal when the first delay clock signal is a 180-degree phase delayed version of the external clock signal.

5. The DLL as claimed in claim 1, wherein the 2-phase delay line comprises first and second delay cell groups each including coarse delay cells having a plurality of set unit delays and a fine delay cell having a half delay of the set unit delay while being enabled.

6. The DLL as claimed in claim 1, wherein the latch is an SR flip-flop performing an SR latch operation by receiving the first pulse signal at its reset input terminal and receiving the second pulse signal at its set input terminal.

7. The DLL as claimed in claim 1, wherein the set duty ratio is a 50-percent duty cycle.

8. A duty correction method in a delay locked loop (DLL) including a duty correction circuit, comprising:
generating first and second delay clock signals having different phase shifts by delaying an external clock signal by as much as first and second set phases in response to a delay control signal;
generating first and second first signals respectively synchronized with the first and second delay clock signals; and
generating an output clock signal having a set duty ratio by using the first and second pulse signals, wherein generating an output clock signal is carried out by an SR flip-flop performing an SR latch operation by receiving the first pulse signal at its reset input terminal and receiving the second pulse signal at its set input terminal.

9. The method as claimed in claim 8, wherein the second delay clock signal is a 360-degree phase delayed version of the external clock signal when the first delay clock signal is a 180-degree phase delayed version of the external clock signal.

10. The method as claimed in claim 8, wherein the first and second delay clock signals are generated by first and second cell groups which are symmetrical with each other.

11. The method as claimed in claim 10, wherein each of the first and second delay cell groups includes coarse delay cells having a plurality of set unit delays and a fine delay cell having a half delay of the set unit delay while being enabled.

12. The method as claimed in claim 10, wherein the first and second pulse signals are generated in synchronization with rising edges of the first and second delay clock signals, respectively.

13. The method as claimed in claim 12, wherein the first and second pulse signals have a duty cycle less than 50 percent.

14. The method as claimed in claim 10, wherein the set duty ratio has a 50-percent duty cycle.

15. A data processing system with a delay locked loop (DLL) including a phase detection circuit generating a phase detection signal by comparing a phase of an output clock signal with a phase of an external clock signal and a delay control circuit generating a delay control signal for determining delay time in response to the phase detection signal, wherein:
the DLL includes a 2-phase delay line configured to generate first and second delay clock signals by delaying the external clock signal by as much as first and second set phases in response to the delay control signal and a duty correction circuit configured to perform duty correction by using the first and second delay clock signals such that a duty cycle of the output clock signal has a set duty ratio, and
the duty correction circuit includes:
a first pulse generator configured to generate a first pulse signal synchronized with a rising edge of the first delay clock signal,
a second pulse generator configured to generate a second pulse signal synchronized with a rising edge of the second delay clock signal, and
an SR latch configured to output the output clock signal having the set duty ratio by using the first and second pulse signals.

16. The data processing system as claimed in claim 15, wherein the data processing system is an SDRAM.

17. The data processing system as claimed in claim 15, wherein the data processing system is a memory controller.

* * * * *